(12) United States Patent
Lin

(10) Patent No.: US 8,570,111 B2
(45) Date of Patent: Oct. 29, 2013

(54) SINGLE-STAGED BALANCED-OUTPUT INDUCTOR-FREE OSCILLATOR AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 83 days.

(21) Appl. No.: 13/287,960

(22) Filed: Nov. 2, 2011

(65) Prior Publication Data
US 2013/0106525 A1 May 2, 2013

(51) Int. Cl.
*H03K 3/354* (2006.01)
(52) U.S. Cl.
USPC ....... 331/108 R; 331/57; 331/113 R; 331/144
(58) Field of Classification Search
CPC ................................ H03K 3/0315; H03B 5/20
USPC ...... 331/57, 59, 108 B, 108 R, 135, 137, 114, 331/113 R, 144, 117 R, 117 FE, 167
See application file for complete search history.

(56) References Cited

U.S. PATENT DOCUMENTS 5,801,593 A * 9/1998 Nguyen ..................... 331/113 R
6,215,369 B1 * 4/2001 Mokhtari et al. ......... 331/108 R

* cited by examiner

*Primary Examiner* — Ryan Johnson
(74) *Attorney, Agent, or Firm* — McClure, Qualey & Rodack, LLP

(57) ABSTRACT

A single-staged balanced-output inductor-free oscillator and method thereof are provided. In one implementation an apparatus includes a first network comprising a first amplifier configured in a self feedback topology via a first feedback network for generating a first end of an output signal; a second network comprising a second amplifier configured in a self feedback topology via a second feedback network for generating a second end of the output signal; and a cross-coupling network for cross-coupling the first end and the second end of the output signal, wherein the first network and the second network share a common supply current and the first feedback network and the second feedback network are configured in a cross-controlling topology.

17 Claims, 2 Drawing Sheets

SINGLE-STAGED BALANCED-OUTPUT INDUCTOR-FREE OSCILLATOR AND METHOD THEREOF

FIELD OF TECHNOLOGY

This disclosure relates generally to oscillators and more particularly to a single-staged balanced-output inductor-free oscillator and method thereof.

BACKGROUND

Voltage-controlled ring oscillators are widely used in numerous applications. A voltage-controlled ring oscillator comprises a plurality of stages of voltage-controlled delay cells (VCDC) configured in a ring topology, wherein each one of said stages of voltage-controlled delay cells receives an input from a preceding stage and outputs an output to a succeeding stage, and a circuit delay from the input to the output is controlled by a control voltage. FIG. 1 depicts a 3-stage voltage controlled ring oscillator 100 comprising three voltage controlled delay cell (VCDC) 110, 120, and 130; each VCDC, configured in a balanced (i.e., differential) circuit topology, has a first (or positive) input terminal $V_{i+}$, a second (or negative) input terminal $V_{i-}$, a first (or positive) output terminal $V_{o+}$, a second (or negative) output terminal $V_{o-}$, and a control terminal VC; an input is defined as a voltage difference between the two input terminals $V_{i+}$ and $V_{i-}$; an output is defined as a voltage difference between the two output terminals $V_{o+}$ and $V_{o-}$; and a circuit delay from the input to the output is controlled by a control voltage applied at the control terminal VC. A control voltage VCTL is applied to all three VCDC 110~130; the control voltage VCTL determines the circuit delay of the three VCDC, and therefore determines an oscillation frequency of the ring oscillator. The circuit delay of each VCDC contributes to a phase shift to the oscillation signal.

To sustain the oscillation, the total phase shift must be 360 degrees when the oscillation signal traverses along the ring and returns to the starting point. To assist the oscillation, a polarity inversion is employed in the ring to introduce a 180 degrees phase shift, so that the requirement of phase shift from the circuit delay of the ring to sustain the oscillation is reduced to 180 degrees. In the three-stage voltage-controlled ring oscillation 100 of FIG. 1, the polarity inversion is employed between the output of VCDC 130 and the input of VCDC 110; to sustain the oscillation, each of the three VCDC needs to contributes 60 degrees of phase shift. Besides the requirement on phase shift, each VCDC also needs to provide a gain for the ring to sustain the oscillation. There are many circuits suitable for embodying a voltage controlled delay cell. In order to provide the gain, a voltage controlled delay cell must include an amplifier circuit. To sustain a high frequency oscillation, the delay of the amplifier circuit must be small and therefore the amplifier must be a high speed amplifier. In general, a high speed amplifier comprising MOS (short for metal-oxide semiconductor field-effect transistor), resistors and/or capacitors contribute to no more than 90 degrees of phase shift. To have 180 degrees of phase shift, at least two stages are needed. Therefore, prior art voltage controlled ring oscillators comprise at least two stages of voltage controlled delay cells. Generally speaking, a single-staged oscillator is feasible only if an inductor is employed to achieve 180 degrees of phase shift. Inductors, however, are expensive and not attractive in a cost sensitive design.

What is desired is a single-staged balanced-output oscillator without using inductor.

SUMMARY

In one embodiment, an oscillator comprises: a first network comprising a first amplifier configured in a self feedback topology via a first feedback network for generating a first end of an output signal; a second network comprising a second amplifier configured in a self feedback topology via a second feedback network for generating a second end of the output signal; and a cross-coupling network for cross-coupling the first end and the second end of the output signal.

In one embodiment, an oscillator comprises: a first self-feedback amplifier for outputting a first end of an output signal; a second self-feedback amplifier for outputting a second end of the output signal; and a cross-coupling network for cross-coupling the first end and the second end of the output signal, wherein the first self-feedback amplifier and the second self-feedback amplifier share a supply current and cross control the self-feedback for each other.

In one embodiment, an oscillator comprises: a first amplifier including a first feedback network for outputting a first end of an output signal; a second amplifier including a second feedback network for outputting a second end of the output signal; a circuit for providing a supply current to the first amplifier and the second amplifier; and a cross-coupling network for cross-coupling the first end and the second end of the output signal, wherein the first feedback network is controlled by the second end of the output signal, and the second feedback network is controlled by the first end of the output signal.

In one embodiment, a method is disclosed, the method comprising: generating a first end of an output signal by amplifying a first end of an intermediate signal; generating a second end of the output signal by amplifying a second end of the intermediate signal; cross-coupling the first end and the second end of the output signal; coupling the first end of the output signal to the first end of the intermediate signal using a first feedback network controlled by the second end of the output signal; coupling the second end of the output signal to the second end of the intermediate signal using a second feedback network controlled by the first end of the output signal.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense, but rather an illustrative sense.

Figure 1:
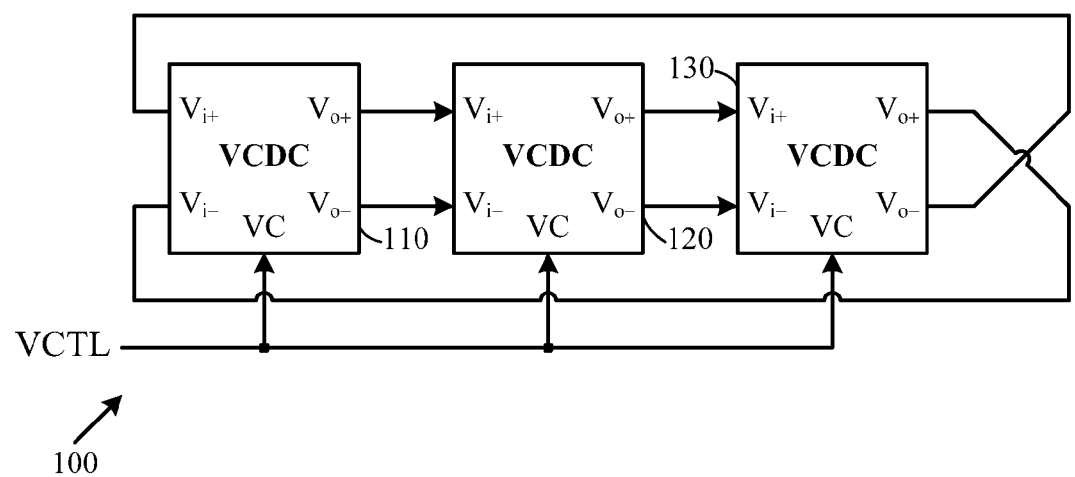
FIG. 1 shows a schematic diagram of a prior art voltage controlled ring oscillator.
Figure 2:
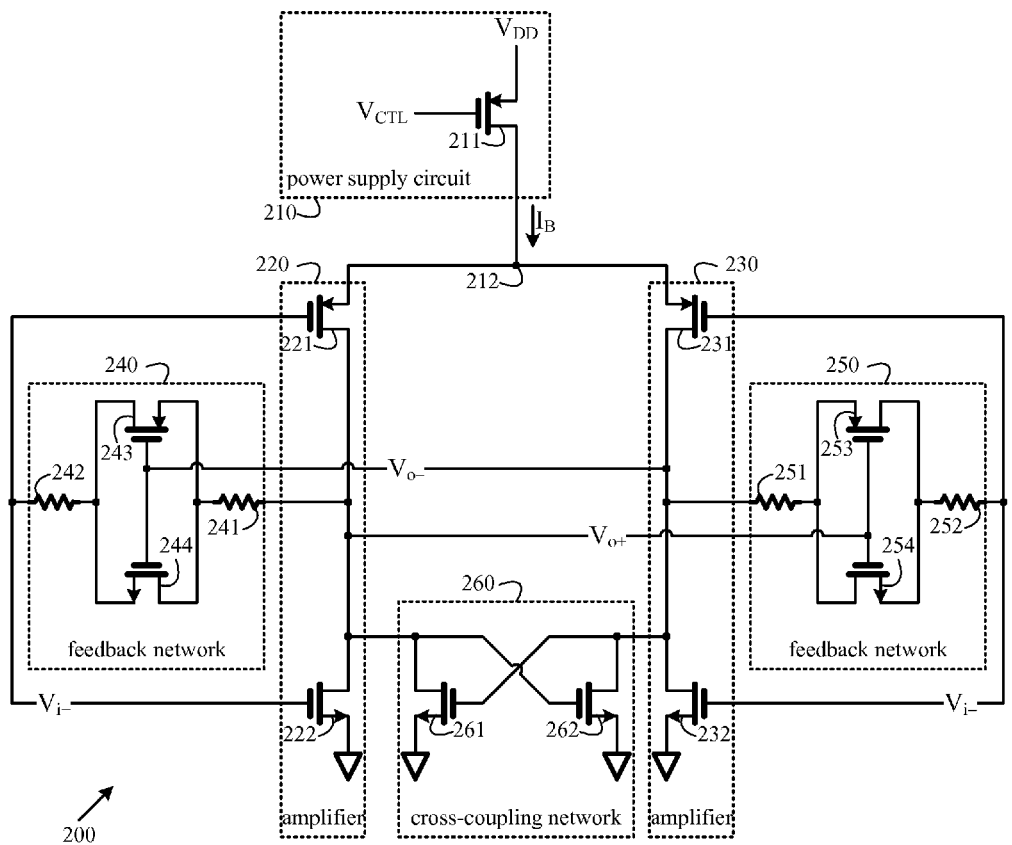
FIG. 2 shows a schematic diagram of an oscillator in accordance with an embodiment of the present invention.

An oscillator 200 in accordance with an embodiment of the present invention is depicted in FIG. 2. Oscillator 200 comprises: a biasing circuit 210 for providing a supply current $I_B$ to a power supply node 212; a differential pair of amplifiers comprising a first amplifier 220 and a second amplifier 230, biased by the supply current $I_B$ from the supply node 212, for receiving a differential intermediate signal $V_i$ comprising a first end $V_{i+}$ and a second end $V_{i-}$ and outputting a differential output signal $V_o$ comprising a first end $V_{o+}$ and a second end $V_{o-}$, wherein the first amplifier 220 receives $V_{i+}$ and outputs $V_{o+}$, and the second amplifier 230 receives $V_{i-}$ and outputs $V_{o-}$; a cross-coupling network 260 for cross-coupling $V_{o+}$ and $V_{o-}$; and a pair of feedback networks comprising a first feedback network 240 and a second feedback network 250 for providing a feedback for the first amplifier 220 and the second amplifier 230, respectively, wherein the first feedback network 240 is controlled by $V_{o-}$ and the second feedback network 250 is controlled by $V_{o+}$. The first amplifier 220 is a CMOS (short for complementary metal-oxide semiconductor filed effect transistor) inverter comprising a first PMOS (short for p-type metal oxide semiconductor field effect transistor) 221 and a first NMOS (short for n-type metal oxide semiconductor field effect transistor) 222. The second amplifier 230 is a CMOS inverter comprising a second PMOS 231 and a second NMOS 232. The first feedback network 240 comprises a serial connection of a first resistor 241, a parallel connection of a third NMOS 244 and a third PMOS 243 configured as a variable resistor controlled by $V_{o-}$, and a second resistor 242.

The second feedback network 250 comprises a serial connection of a third resistor 251, a parallel connection of a fourth NMOS 254 and a fourth PMOS 253 configured as a variable resistor controlled by $V_{o+}$, and a fourth resistor 252. The cross-coupling network 260 comprising a fifth NMOS 261 and a sixth NMOS 262. The biasing circuit comprising a fifth PMOS 211 for outputting the supply current $I_B$ to the power supply node 211 in accordance with a control voltage $V_{CTL}$. Here, $V_{DD}$ denotes a fixed potential circuit node. In an alternative embodiment not shown in figure, the fifth PMOS 211 is removed and the power supply node 211 is directly coupled to the control voltage $V_{CTL}$. The principle of oscillator 200 is described as follows.

The first amplifier 220 along with the first feedback network 240 forms a first half of the oscillator 200, while the first amplifier 230 along with the second feedback network 250 forms a second half of the oscillator 200. Due to sharing the same supply current $I_B$, the first half and the second half oscillates in opposite polarity, i.e. when $V_{o+}$ rises, $V_{o-}$ falls, and vice versa. For each half of the oscillator 200, the respective amplifier (220, 230) introduces 180 degrees of phase shift due to the inverting nature of the amplifier and additional 90 degrees of phase shift due to a parasitic capacitive load at the output of the amplifier. (Note that every MOS device leads to a parasitic capacitance.) Although the respective amplifier has a finite output resistance that would have reduced the additional phase shift to less than 90 degrees, the finite output resistance is cancelled by the cross-coupling network 260, which in a differential circuit topology is equivalent to a negative resistor that can cancel the finite output resistance.

Figure 3:
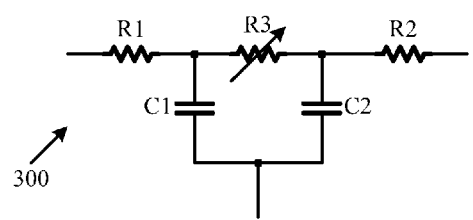
FIG. 3 shows a schematic diagram of an equivalent circuit of the feedback network of the oscillator of FIG. 2.

For each half of the oscillator 200, the respective feedback network (240, 250) is equivalent to a ladder RC circuit 300, shown in FIG. 3, comprising a front-side resistor R1 (representing resistor 241 or 251), a front-side parasitic shunt capacitor C1 (of PMOS 243 & NMOS 244, or PMOS 253 & NMOS 254), a variable resistor R3 (representing a resistance of PMOS 243 in parallel with NMOS 244, or PMOS 253 in parallel with NMOS 254), a rear-side parasitic capacitor C2 (of PMOS 243 & NMOS 244, or PMOS 253 & NMOS 254), and a rear-side resistor R2 (representing resistor 241 or 251).

Such a ladder RC circuit is sufficient to provide 90 degrees of phase shift. A total phase shift of 360 degrees, therefore, is attained to sustain oscillation by using the amplifier (220, 230) along with the feedback network (240, 250). The two halves of the oscillator are cross-controlled, i.e. the first feedback network 240 for the first half is controlled by the output of the second half ($V_{o-}$), while the second feedback network 250 for the second half is controlled by the output of the first half ($V_{o+}$). This arrangement enhances the strength of the feedback by lowering the total effective resistance for the two feedback networks when a magnitude of the output signal is large, thus helping to attain a higher oscillation frequency.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An oscillator comprising:
    a first network comprising a first amplifier configured in a self feedback topology via a first feedback network for generating a first end of an output signal;
    a second network comprising a second amplifier configured in a self feedback topology via a second feedback network for generating a second end of the output signal; and
    a cross-coupling network for cross-coupling the first end and the second end of the output signal, wherein the first feedback network and the second feedback network are configured in a cross-controlling topology, wherein a total effective resistance of the first feedback network decreases when a magnitude of the second end of the output signal increases and a total effective resistance of the second feedback network decreases when a magnitude of the first end of the output signal increases.

2. The oscillator of claim 1, wherein: the first feedback network includes a serial connection of a first resistor and a first transistor controlled by the second end of the output signal, and the second feedback network includes a serial connection of a second resistor and a second transistor controlled by the first end of the output signal.

3. The oscillator of claim 2, wherein: the first feedback network further includes a third resistor in serial connection with the first transistor, and the second feedback network further includes a fourth resistor in serial connection with the second transistor.

4. The oscillator of claim 1, wherein the first network and the second network share a common supply current.

5. The oscillator of claim 4 further comprising a power supply circuit for supplying the common supply current in accordance with a control voltage.

6. The oscillator of claim 1, wherein the cross-coupling network is configured so as to function as a load with a negative resistance to both the first amplifier and the second amplifier.

7. An oscillator comprising:
    a first amplifier including a first feedback network for outputting a first end of an output signal;
    a second amplifier including a second feedback network for outputting a second end of the output signal;

a circuit for providing a supply current to the first amplifier and the second amplifier; and a cross-coupling network for cross-coupling the first end and the second end of the output signal, wherein the first feedback network is controlled by the second end of the output signal, and the second feedback network is controlled by the first end of the output signal, wherein a total effective resistance of the first feedback network decreases when a magnitude of the second end of the output signal increases and a total effective resistance of the second feedback network decreases when a magnitude of the first end of the output signal increases.

8. The oscillator of claim 7, wherein: the first feedback network includes a serial connection of a first resistor and a first transistor controlled by the second end of the output signal, and the second feedback network includes a serial connection of a second resistor and a second transistor controlled by the first end of the output signal.

9. The oscillator of claim 8, wherein: the first feedback network further includes a third resistor in serial connection with the first transistor, and the second feedback network further includes a fourth resistor in serial connection with the second transistor.

10. The oscillator of claim 7, wherein the supply current is controlled by a control voltage.

11. The oscillator of claim 7, wherein the cross-coupling network is configured so as to function as a load with a negative resistance to both the first amplifier and the second amplifier.

12. The oscillator of claim 7, wherein the first feedback network and the second feedback network are configured to introduce a 90 degree phase shift for the first end and the second end of the output signal, respectively.

13. A method applied to an oscillator comprising:
generating a first end of an output signal by amplifying a first end of an intermediate signal;
generating a second end of the output signal by amplifying a second end of the intermediate signal;
cross-coupling the first end and the second end of the output signal;
coupling the first end of the output signal to the first end of the intermediate signal using a first feedback network controlled by the second end of the output signal;
coupling the second end of the output signal to the second end of the intermediate signal using a second feedback network controlled by the first end of the output signal, wherein a total effective resistance of the first feedback network decreases when a magnitude of the second end of the output signal increases and a total effective resistance of the second feedback network decreases when a magnitude of the first end of the output signal increases.

14. The method of claim 13, wherein: the first feedback network includes a serial connection of a first resistor and a first transistor controlled by the second end of the output signal, and the second feedback network includes a serial connection of a second resistor and a second transistor controlled by the first end of the output signal.

15. The method of claim 14, wherein: the first feedback network further includes a third resistor in serial connection with the first transistor, and the second feedback network further includes a fourth resistor in serial connection with the second transistor.

16. The method of claim 13, wherein a supply current is controlled in accordance with a control voltage.

17. The method of claim 13, wherein the first feedback network and the second feedback network are configured to introduce a 90 degree phase shift for the first end and the second end of the output signal, respectively.

* * * * *